United States Patent [19]

Brown

[11] Patent Number: 4,677,736

[45] Date of Patent: Jul. 7, 1987

[54] SELF-ALIGNED INLAY TRANSISTOR WITH OR WITHOUT SOURCE AND DRAIN SELF-ALIGNED METALLIZATION EXTENSIONS

[75] Inventor: Dale M. Brown, Schenectady, N.Y.

[73] Assignee: General Electric Company, Schenectady, N.Y.

[21] Appl. No.: 853,108

[22] Filed: Apr. 17, 1986

[51] Int. Cl.$^4$ .......................................... H01L 21/283
[52] U.S. Cl. ................... 29/571; 29/576 B; 29/578; 29/591
[58] Field of Search ...................... 357/23.9, 23.11, 49, 357/23.3; 29/571; 148/187

[56] References Cited

U.S. PATENT DOCUMENTS

| | | | |
|---|---|---|---|
| 4,419,810 | 12/1983 | Riseman | 29/571 |
| 4,472,872 | 9/1984 | Toyoda et al. | 29/578 |
| 4,536,782 | 8/1985 | Brown | 29/78 |
| 4,577,392 | 3/1986 | Peterson | 29/571 |
| 4,599,789 | 7/1986 | Gasner | 29/571 |

OTHER PUBLICATIONS

Bassous et al., "Self-Aligned Polysilicon Gate MOSFETs with Tailored Source and Drain Profiles", IBM Tech. Dis. Bulletin, vol. 22, No. 11, Apr. 1980.

Primary Examiner—Brian E. Hearn
Assistant Examiner—Seung Ham
Attorney, Agent, or Firm—Lawrence D. Cutter; James C. Davis, Jr.; Marvin Snyder

[57] ABSTRACT

A self-aligned process is described for depositing gate electrode material in an inlay field effect transistor. The process particularly provides means for inclusion of lightly doped source and drain extensions to minimize high field effects in the channel region. The process described herein is also particularly useful for providing source and drain contact metal which also acts as an ion implantation mask layer during several of the process steps. The method described herein is usable in conventional VLSI fabrication production facilities.

31 Claims, 16 Drawing Figures

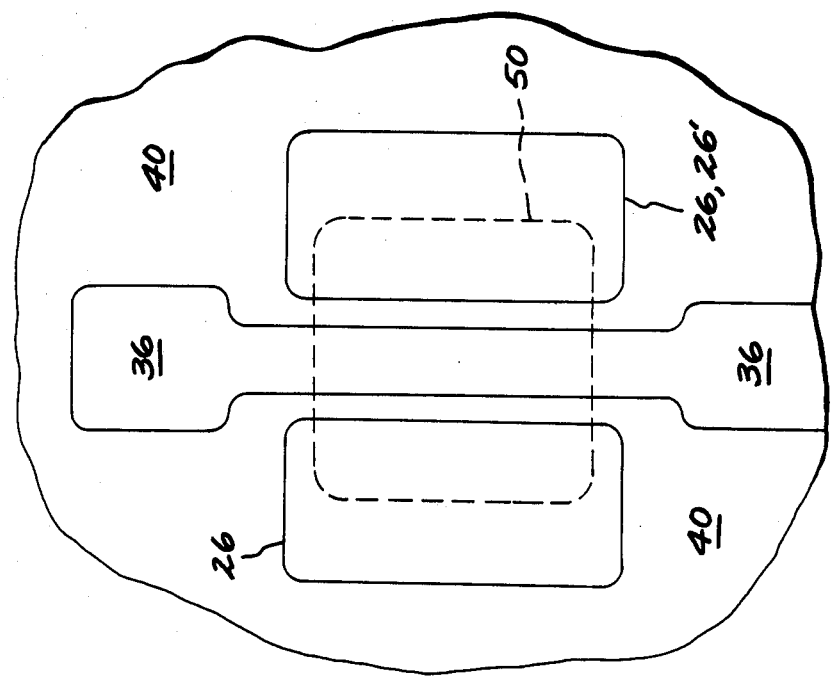
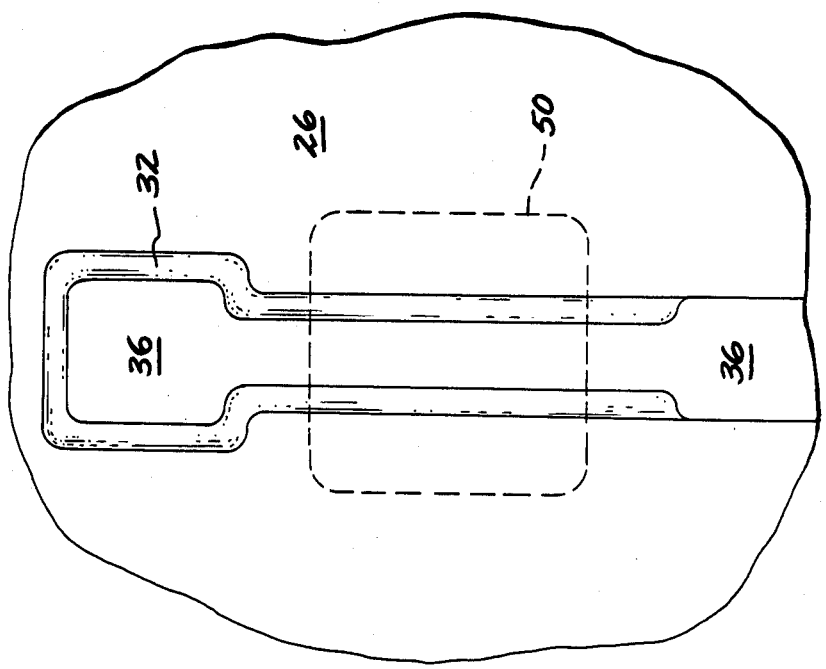

SELF-ALIGNED INLAY TRANSISTOR WITH OR WITHOUT SOURCE AND DRAIN SELF-ALIGNED METALLIZATION EXTENSIONS

BACKGROUND OF THE INVENTION

The present invention is generally directed to the fabrication of field effect transistor (FET) devices. More particularly, the present invention is directed to a method for the fabrication of an inlay transistor with self-aligned source and drain and metallization areas. Additionally, the process of the present invention is amenable to fabrication of lightly doped drain and/or source regions to reduce problems associated with electric high fields in the transistor channel region.

As integrated circuit dimensions have shrunk, the supply voltages supplied to various chip devices have not been correspondingly scaled. The primary reason for this failure to scale is the inconvenience of providing power supply voltages at a multitude of distinct levels. Compatibility with existing systems and integrated circuit boards is also a factor. This situation, namely the shrinking of device dimensions together with the lack of reduction in supply voltage, naturally leads to situations in which high electric fields are present, particularly in the channel region of field effect transistor devices. Accordingly, it is desirable to provide source and drain region profiles which mitigate the high electric field problem. Lightly doped source and drain region extensions provide one mechanism for mitigating this problem.

Very large scale integrated circuit (VLSI) fabrication methods employ masks through which photoresist materials are exposed, developed, and selectively removed. The larger the number of electrical and electronic components that are disposed on such circuit chips, the greater is the problem of mask registration and alignment. That is to say, masking processes after the first must provide proper alignment with the patterns that have previously been disposed on the semiconductor substrate. It is accordingly seen then that it is generally desirable to employ fewer masking steps whenever possible. This is particularly true for the purpose of avoiding registration errors from the one masking pattern to the next. However, as dimensions shrink, alignment becomes more difficult.

It is therefore seen that the problem of high field strength together with mask registration each act to limit the dimensions to which integrated circuits can be shrunk. Each of these problems are, however, mitigated by the process of the present invention in which self-aligned structures are employed which do not require masking operations for their formation.

SUMMARY OF THE INVENTION

In accordance with a preferred embodiment of the present invention, a field effect transistor is formed in a multi-step fabrication process comprising the following steps. First, an active region is formed in a semiconductor substrate so that the active region is surrounded by an insulative material separating the active region from the rest of the substrate. The surrounding insulative material is typically referred to as the field oxide. A first ion implantation mask layer is then disposed (e.g., by deposition and patterning) on the active region in substantially the pattern which is desired for a gate electrode for the field effect transistor. The gate electrode pattern, however, generally extends beyond the active region. Next, doped regions are formed in the active region on either side of the first gate electrode. This forms the source and drain regions in the semiconductor substrate or body. Typically, the doped regions forming the source and drain are heavily doped with a dopant of opposite polarity from a dopant already present in the semiconductor substrate. Next, second ion implantation mask layer is deposited over the substrate and planarized at least down to the level of the first mask layer. It is noted that the mask employed for forming the active region involves a non-critical mask alignment process step and that the only critical masking process step is in the formation of the first ion implantation mask layer. Next, the first mask layer is removed and oxide sidewall spacers are formed on substantially vertical walls of the second mask layer. An insulative gate layer is then formed or deposited on a portion of the semiconductor body exposed by reason of removal of the first mask layer. These process steps result in the formation of a well substantially in the shape of a desired gate electrode. The bottom and sides of the well comprise insulative material. At this point, conductive gate electrode material is deposited and is preferably planarized so that the gate material fills the well and is configured in a desired shape both as an electrode overlying the active area and as a gate electrical lead extending beyond the active area, as necessary or desired. The insulative sidewall spacer material may then optionally be removed and an ion implantation performed so as to result in less heavily doped source and drain extension regions extending into the device channel area. If lightly doped field mitigating structures are not desirable, then these two process steps may be eliminated. If desired, particularly for the purpose of forming interlayer dielectric material, an insulative layer of spacer oxide may be redeposited.

In a preferred embodiment of the present invention, the second ion implantation mask layer comprises a conductive material such as molybdenum, tungsten or silicides such as $WSi_2$, $MoSi_2$ or $TiSi_2$. In such cases, this mask layer itself may be patterned to form source and drain contact electrodes. However, it is also possible to entirely remove the second mask layer and form source and drain contacts using other metals, such as by selective or non-selective chemical vapor deposition, sputtering, or evaporation. Such processes also typically entail a planarization process step.

Accordingly, it is an object of the present invention to provide a process for inlay gate formation.

It is also an object of the present invention to provide a process for field effect transistor fabrication employing as many self-aligned process steps as possible.

It is yet another object of the present invention to provide a process for FET fabrication in which lightly doped drain or source regions are present.

It is a still further object of the present invention to mitigage problems associated with high electric fields in the channel regions of FET devices.

It is also an object of the present invention to limit source and drain metallization extensions to reduce parasitic capacitance normally associated with non-selfaligned contacts to FET transistor diodes.

Lastly, but not limited hereto, it is an object of the present invention to provide transistor fabrication processes which facilitate shrinking device dimensions, preferably to submicron levels.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 15 is a plan view illustrating one embodiment of the present invention in which the gate electrode is "necked down" as it passed over the active region; and FIG. 16 is a plan view more particularly illustrating one embodiment of the present invention in which the second mask layer is patterned to provide extended metal contacts to the source and drain regions of the device.

DETAILED DESCRIPTION OF THE INVENTION

Figure 1:
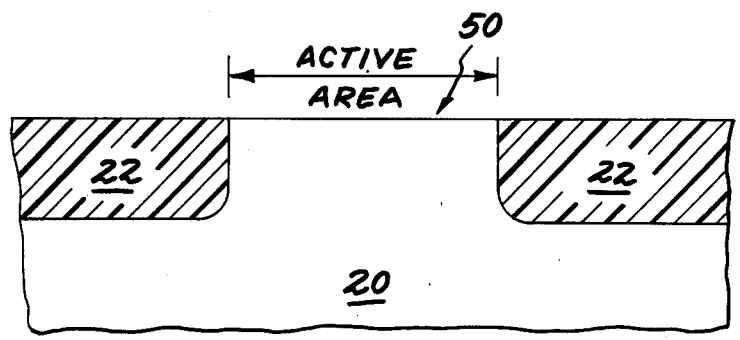
FIGS. 1–14 are cross-sectional, side elevation views illustrating a sequence of process steps in accordance with the present invention.

In accordance with a preferred embodiment of the present invention, active area 50 (as seen in FIG. 1) is formed in a semiconductor substrate 20. Active area 50 may be formed by conventional isoplanar and etchback methods or by a sidewall or trench isolation process. In each case, a semiconductor body such as silicon 20, is produced in which insultative material 22 such as silicon dioxide, serves to isolate active area 50 from the rest of the substrate. Semiconductor body 20 typically comprises a material such as crystalline silicon doped with an appropriate polarity dopant typically a P- type dopant. Accordingly, FIG. 1 shows active area 50 surrounded by insulative islands 22. Semiconductor body 20 typically comprises silicon and islands 22 comprise silicon oxide and are typically referred to as the field or field oxide region of the substrate. It is noted that the masking step for the formation of the active area is non-critical, that is, significant alignment and registration problems are not present for this masking operation since it is the first step in the process.

Figure 2:
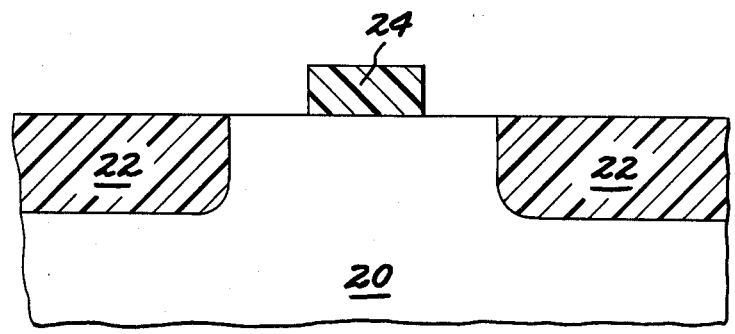

Next, as illustrated in FIG. 2, a first ion implantation mask layer 24 is provided. Typically, a layer of mask material such as silicon nitride is deposited and patterned using a mask which defines the gate pattern. This is the only device gate masking pattern step employed. The pattern provided for mask layer 24 is substantially the desired pattern for the gate electrode. This pattern typically extends a certain some distance beyond active area 50. While mask layer 24 preferably comprises a material such a silicon nitride, the practice of the present invention is not limited thereto, but may also include any other selectively etchable material such as molybdenum, tungsten, aluminum, polysilicon or silicon oxide. Metals are preferred, but not more preferred than silicon nitride.

Figure 3:
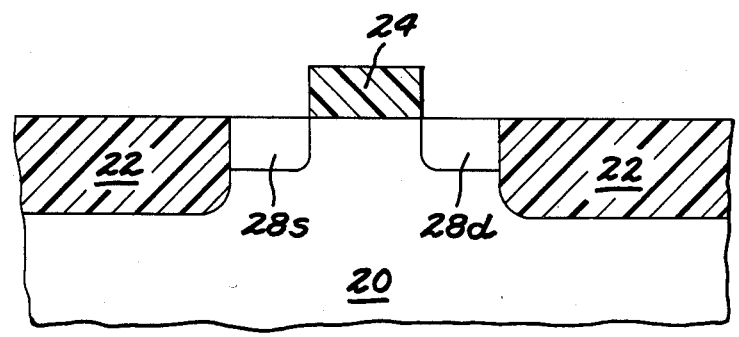

As illustrated in FIG. 3, semiconductor body 20 is provided with doped regions 28s and 28d forming source and drain regions. Doping of semiconductor substrate 20 is preferably accomplished by ion implantation. If semiconductor body 20 is doped with P-type dopants, then regions 28s and 28d are preferably doped with N-type dopants. Dopant concentration and ion implant energy levels are chosen to provide a relatively heavy (say $N^+$) doping for the source and drain rgions. Subsequent doping operations may also optionally be carried out to produce lightly doped source and drain region extensions. These are discussed below.

Figure 4:
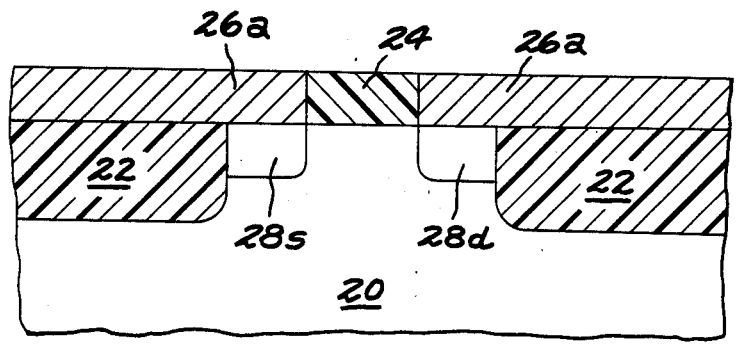
Figure 5:
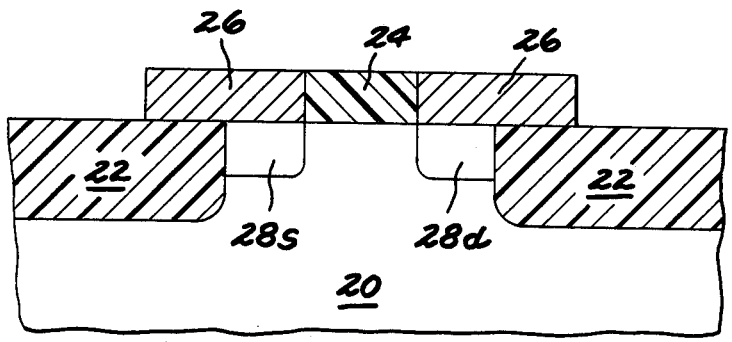

Next, second ion implantation mask layer 26a is deposited and planarized as shown in FIG. 4. Layer 26a preferably comprises a material other than silicon nitride and certainly a material different than that used in first ion implantation mask layer 24. In particular, this material may comprise polycrystalline silicon, metal, or silicon oxide. Preferable metals include molybdenum and tungsten or silicides such as tungsten silicide, molybdenum silicide or titanium silicide. In particular, if layer 26a comprises metal or metal silicide, then this material may be patterned, as illustrated in FIG. 5, to form metal electrode contacts 26 for the source and drain regions.

Figure 6:
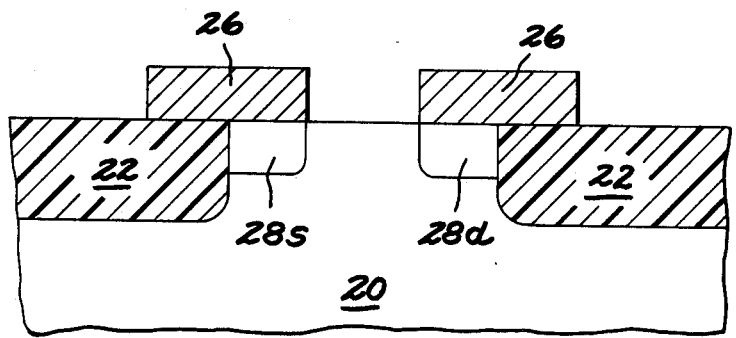
Figure 7:
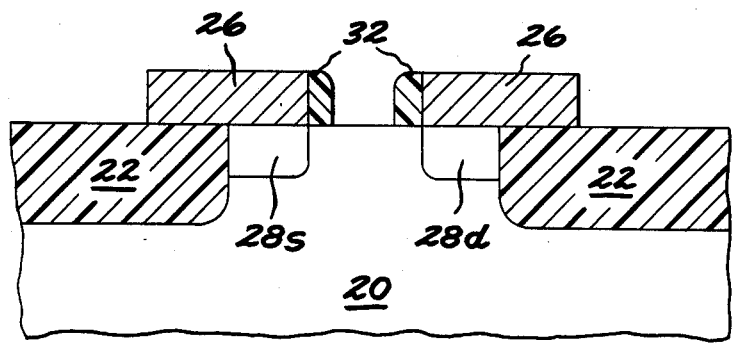

Next, as illustrated in FIG. 6, the rest of first ion implantation mask layer 24 is removed. Further, as shown in FIG. 7, oxide spacer material is deposited on the sidewalls of layer 26. This deposition is accomplished by low pressure chemical vapor deposition using silane and nitrous oxide. It is noted that formation of oxide spacer material 32 is shown only as being present in the channel region of the FET device being formed. One mechanism for accomplishing this object is delaying the patterning of layer 26a shown in FIG. 4. In such a sequence, spacer oxide material 32 is deposited only in the active area as shown in FIG. 7.

Figure 8:
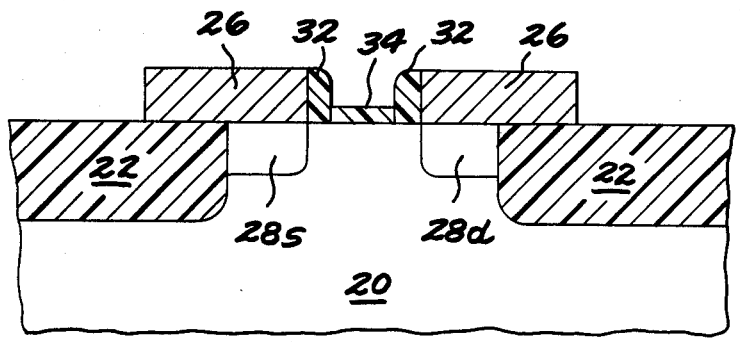

Next, semiconductor material 20 is provided with a thin insultative layer 34 which ultimately acts as gate insulation material. Typically, insultative layer 34 is formed by an oxidation process of silicon material 20. if layer 26 comprises metal such as tungsten or molybdenum, then this oxide may be formed using a mixture of hydrogen and water vapor without oxidizing the metal. Alternatively, layer 26 may comprise a silicide which can be oxidized. Also, gate dielectric material 34 may be deposited. In either case, the resulting structure is illustrated in FIG. 8.

Figure 9:
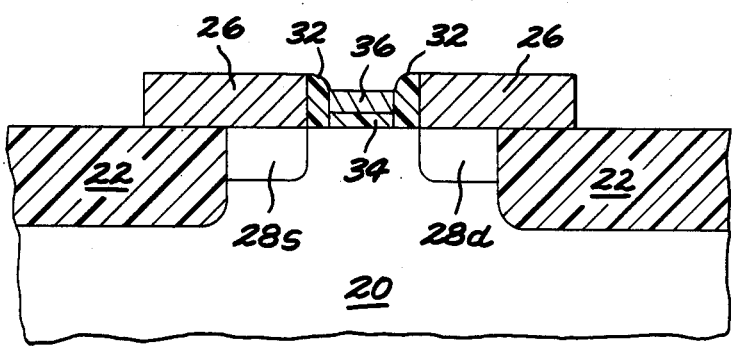

Next, gate material 36 is deposited and planarized to the surface of layer 26 or slightly below it. Gate electrode 26 may comprise material such as polycrystalline silicon, molybdenum, or tungsten or silicides such as tantalum silicide or palladium silicide. The resulting structure is illustrated in FIG. 9. If lightly doped source and drain regions are not desired and if the second mask layer comprises metal, an enhancement mode MOSFET as shown in FIG. 9 can be formed by lateral diffusion of the source and drain dopant under the oxide spacers to form self-aligned junction edges at or slightly underneath the gate edges. A functional FET is now present and processing could stop except for covering the device with a passivation layer and interconnecting other devices. Otherwise, a depletion mode device is already formed since the conductive channel region is already present and gate modulation can be used to either enhance or decrease or "turn off" the channel conductance. N-channel enhancement and depletion devices are formed on the same wafer by providing appropriate dopants in region 28 and by using appropriate masking. For instance, the depletion mode device regions 28 are doped with arsenic (a slow diffuser) and enhancement mode device regions 28 are doped with phosphorous (a fast diffuser).

Figure 10:
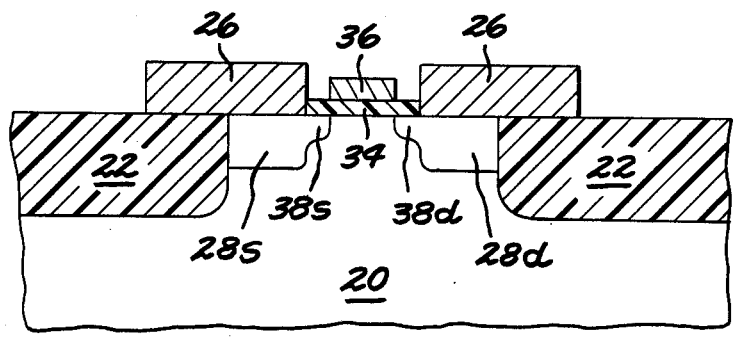
Figure 11:
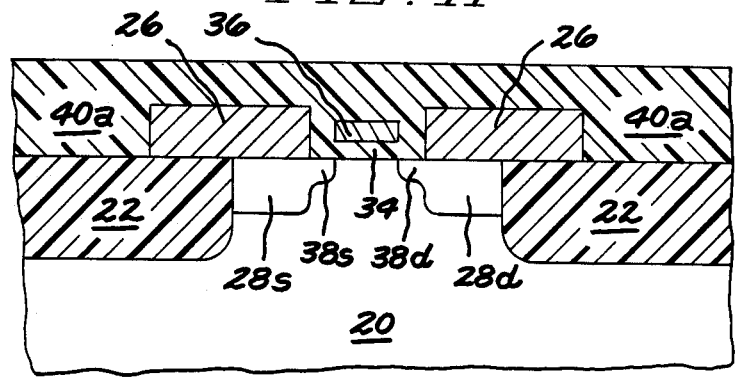

In order to achieve self-alignment for lightly doped regions with respect to the source and and drain contact regions, oxide spacer material 32 is selectively removed and a lightly doped (say $N^-$) implantation is carried out. Implantation is carried out through gate insulation layer 34 and forms source and drain region extensions 38s and 38d extending from regions 28s and 28d, respectively. The dopant concentration and ion implantation energy levels are selected to produce substantially the dopant distribution illustrated in FIG. 10. in the event that layer 26 comprises metal suitable for use as contact material for source and drain electrodes, a lightly doped transistor structure is complete. However, for purposes of passivation and inclusion of a dielectric layer, oxide material 40a may be redeposited, as shown in FIG. 11.

Figure 12:
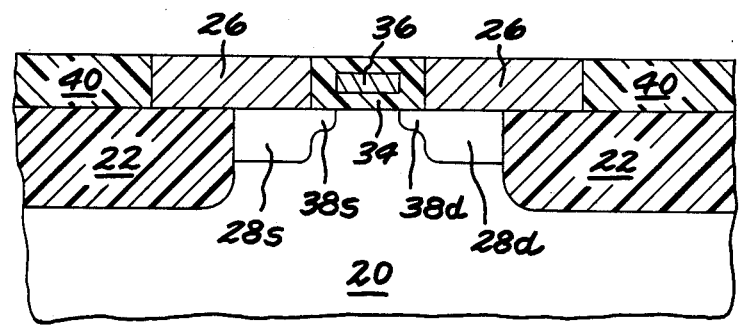
Figure 13:
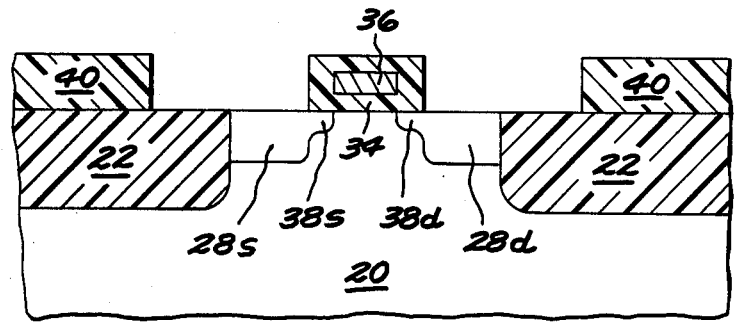
Figure 14:
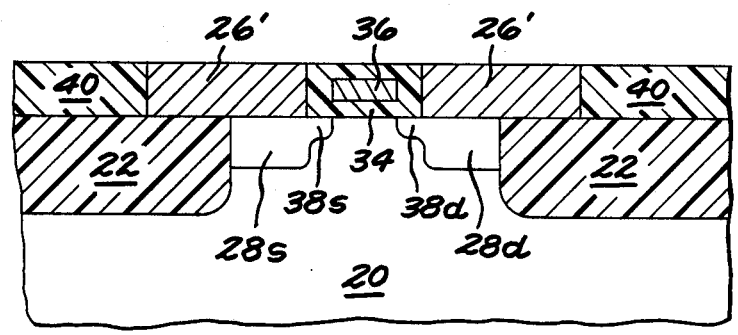

Dielectric 40a may be planarized to produce insulative patches 40, as shown in FIG. 12. In the event that the invention as illustrated in FIG. 12 is practiced, then gate electrode material 36 can be made thicker and essentially coplanar with the top surfaces of diode contacts 26. Subsequently, an interconnectional metal layer can be used to locally interconnect gate pattern 36 with adjacent diode contacts 26. this is advantageous for high packing density in integrated circuits. In the event that second ion implantation masking layer 26 is unsuitable or undesirable as a source or drain electrode contact material, portions 26 overlying the source and drain regions may be selectively etched, resulting in the structure shown in FIG. 13. Appropriate source and drain contact material 26' may then be deposited and planarized as necessary. This deposition may be achieved by chemical vapor deposition, but sputtering or by evaporation, again with planarization as needed. The resulting structure is shown in FIG. 14.

If one wishes to provide a "necking down" of the gate material, then one may employ a non-critical masking step to remove spacer oxide material outside the active area 50 before deposition of material for gate electrode 36. It must be noted, however, that since gate electrode material can be thick since it is not patterned by lithography and etching, the conductivity of the resulting gate line is higher than that which is normally achieved for submicron gates using conventional patterning methods. A gate landing pad via an enlargment of the gate line beyond the active areas is shown in the plan view of FIG. 15. However, if the extended metal contacts to the source and drain regions, as shown in FIG. 10 are employed, a plan view of the resulting structure appears as shown in FIG. 16. In FIGS. 15 and 16, like structures are provided with the same reference numerals, as above.

In the process step illustrated in FIG. 10, it is also noted that if ion implantation mask layer 26 comprises metal, annealing at approximately 650° C. or flash annealing may be used to anneal the lightly doped implant. If material 26 comprises a metal silicide, normal thermal sintering is used since no reaction can take place with the underlying silicon material.

It is noted that while the process steps described above are generally directed to the employment of silicon as a semiconductor substrate, it is also possibe to employ the substrates of other semiconductor materials such as gallium arsenide. In particular, it should be noted however, that in the case of MESFETs, which employ Schottky barrier forming electrodes, such as titanium tungsten alloys, it is not necessary to form a gate insulative layer such as layer 34. This is also true of junction gate FETs (JFETs) where a diffused diode is employed as a element which is subsequently contacted with any suitably conductive material.

Also, it is noted that the process described above has generally been directed to a situation in which semiconductor body 20 comprises P-doped material, regions 28s and 28d are $N^+$-doped and regions 38s and $N^-$-doped regions to make N-channel devices. However, opposite polarity dopants are employed to make P-channel devices. CMOS devices are fabricated by appropriate ion implantation and masking during source and drain doping of regions 28 and 38.

From the above, it should be appreciated that the process described herein is well adapted to conventional VLSI processing and fabrication. It is also seen that the process described herein is particularly advantageous in that few masking steps are required and that none of these masking steps is critical. It is also seen that the process is particularly advantageous in that the secondion implantation mask layer also may be employed as a layer which constitutes the source and drain contacts. Source and drain contacts are therefore substantially aligned with the silicon diodes and no further masking or patterning is required to form these contacts. This makes it possible to considerably reduce the device diode areas which enhances the speed and performance characteristics of FET devices by reduction of the parasitic diode capacitances. It is also seen that the gate material may be deposited not only to provide a pad for gate electrode contact, but also to provide an extremely narrow gate electrode resulting in a desirably narrow or short channel length for FET devices.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method of fabricating field effect transistors, said method comprising the steps of:

forming an active region in a semiconductor substrate, said active region being surrounded by insultative material;

forming a first ion implantation mask layer in said active region, said first mask layer being disposed in substantially the pattern desired for a gate electrode for said field effect transistor;

forming doped regions in said active region on either side of said first mask layer so as to form source and drain regions in said semiconductor substrate;

depositing a second ion implantation mask layer over said substrate and planarizing said second mask layer at least down to the level of said first mask layer said first and second mask layers comprising distinct material;

removing said first mask layer;

forming oxide spacers ont he sidewalls of said second mask layer in said active region;

forming a gate insultative layer on said substrate between said sidewall spacers;

depositing conductive gate electrode material over said insulative gate material and between said sidewall spacers, whereby a gate electrode for said field effect transistor is formed;

planarizing said gate electrode material at least to the level of said second mask layer;

selectively removing said sidewall spacer material; and forming less heavily doped regions on either side of said gate electrode in said semiconductor substrate.

2. The method of claim 1 further including the step of redepositing a layer of spacer oxide material.

3. The method of claim 2 further including the step of planarizing said redeposited spacer oxide layer at least down to the level of said second mask layer.

4. The method of claim 1 in which said second mask layer comprises metal.

5. The method of claim 4 in which said metal is selected from the group consisting of tungsten molybdenum, and combinations thereof.

6. The method of claim 1 in which said gate pattern increases in width as said gate pattern leaves said active region so as to provide a gate electrode contact pad outside of said active region.

7. The method of claim 1 in which said semiconductor substrate comprises silicon.

8. The method of claim 1 in which said surrounding insulative material comprises silicon oxide.

9. The method of claim 1 in which said doping is performed by ion implantation.

10. The method of claim 1 in which said first mask layer comprises silicon nitride.

11. The method of claim 10 in which said second mask layer comprises material selected from the group consisting of polycrystalline silicon, molybdenum, tungsten, silicon oxide, and silicides.

12. The method of claim 1 in which said first mask layer is removed by selective etching.

13. The method of claim 1 in which said second mask layer comprises metal and said gate oxide is formed in an atmosphere of hydrogen and water vapor.

14. The method of claim 1 in which said second mask layer comprises a silicide and is oxidized in the formation of said gate insulative layer.

15. The method of claim 1 in which said gate insultation is deposited.

16. The method of claim 1 in which said gate insulation comprises a thermal nitride.

17. The method of claim 1 in which second mask layer comprises metal and is patterned to provide electrical contacts to said source and drain regions.

18. The method of claim 17 in which said patterning is non-critical.

19. The method of claim 1 further including a step of redepositing spacer oxide material over said substrate, whereby a dielectric layer is formed for insultative pruposes and for deposition of subsequent metallization layers.

20. The method of claim 1 further including a step of redepositing spacer oxide material and planarizing same at least to the level of said second mask layer.

21. The method of claim 20 further including a step of selectively removing said scond mask layer.

22. The method of claim 21 further including a step of disposing contact metal in the region occupied by said finally removed second mask layer material.

23. The method of claim 22 further including a step of planarizing said contact material.

24. The method of claim 1 in which said second mask layer comprises material selected from the group consisting of polycrystalline silicon, silicon oxide, molybdenum, tungsten silicide, molybdenum silicide and titanium silicide.

25. The method of claim 1 in which said first mask layer comprises material selected from the group consisting of molybdenum, tungsten, aluminum, polysilicon, silicon oxide and silicon nitride.

26. The method of claim 1 in which said gate electrode material is selected from the group consisting of polycrystalline silicon, silicon, molybdenum, tungsten, and metal silicides.

27. A method of fabricating field effect transitors, said method comprising the steps of:
forming an active region in a semiconductor substrate, said active region being surrounded by insulative material;
forming a first ion implantation mask layer in said active region, said first mask layer being disposed in substantially the pattern desired for a gate electrode for said field effect transistor;
forming doped regions in said active region on either side of said first mask layer so as to form source and drain regions in said semiconductor substrate;
depositing a second ion implantation mask layer over said substrate and planarizing said second mask layer at least down to the level of said first mask layer, said first and secon mask layers comprising distinct material;
removing said first mask layer;
forming oxide spacers on the sidewalls of said second mask layer in said active region;
forming a gate insultative layer on said substrate between said sidewall spacers;
depositing conductive gate electrode material over said insultative gate material and between said sidewall spacers, whereby a gate electrode for said field effect transistor is formed;
planarizing said gate electrode material at least to the level of said second mask layer.

28. A method of fabricating field effect transistors, said method comprising the step of:
forming an active region in a semiconductor substrate, said active region being surrounded by insulative material;
forming a first ion implantation mask layer in said active region, said first mask layer being disposed in substantially the pattern desired for a gate electrode for said field effect transistor;
forming doped regions in said active region on either side of said first mask layer so as to form source and drain regions in said semiconductor substrate;
depositing a second ion implantation mask layer over said substrate and planarizing said second mask layer at least down to the level of said first mask layer said first and second mask layers comprising distrinct material;
removing said first mask layer;
forming oxide spacers on the sidewalls of said second mask layer in said active region;
depositing conductive gate electrode material between said sidewall spacers, whereby a gate electrode for said field effect transistor is formed; and
planarizing said gate electrode material at least to the level of said second mask layer.

29. The method of claim 28 further including, after forming said oxide spacers, forming a gate insultative layer on said substrate between said sidewall spacers.

30. The method of claim 29 further including, after said planarizing step. selectively removing said sidewall spacer material and forming less heavily doped regions on either side of said gate electrode in said semiconductor substrate.

31. A method of fabricating field effect transistors in which formation of a gate structure for said transistor is produced by self alignment of said gate structure with respect to previously formed source and drain contact material or to previously formed material for which said source and drain contact material is subsequently substituted.

* * * * *